(12) United States Patent
Tu (10) Patent No.: US 10,395,726 B2
(45) Date of Patent: Aug. 27, 2019

(54) FUSE ARRAY AND MEMORY DEVICE (71) Applicant: Winbond Electronics Corp., Taichung (TW)

(72) Inventor: Ying-Te Tu, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 27 days.

(21) Appl. No.: 15/871,476

(22) Filed: Jan. 15, 2018

(65) Prior Publication Data
US 2018/0366183 A1 Dec. 20, 2018

(30) Foreign Application Priority Data

Jun. 15, 2017 (CN) .......................... 2017 1 0450312

(51) Int. Cl.
G11C 11/41 (2006.01)
G11C 11/4076 (2006.01)
H03K 3/0233 (2006.01)
G11C 17/14 (2006.01)
G11C 17/16 (2006.01)
G11C 29/00 (2006.01)
G11C 11/4097 (2006.01)
G11C 19/00 (2006.01)

(52) U.S. Cl.
CPC ............ *G11C 11/41* (2013.01); *G11C 17/143* (2013.01); *G11C 17/16* (2013.01); *G11C 29/787* (2013.01); *H03K 3/02332* (2013.01); *G11C 11/4076* (2013.01); *G11C 11/4097* (2013.01); *G11C 19/00* (2013.01)

(58) Field of Classification Search
CPC .. G11C 11/41; G11C 11/4076; H03K 3/02332
See application file for complete search history.

(56) References Cited

U.S. PATENT DOCUMENTS

| 5,677,917 A * | 10/1997 | Wheelus | G11C 29/835 714/724 |
| 6,400,292 B1 * | 6/2002 | Maeno | G11C 29/802 341/100 |
| 7,499,351 B2 | 3/2009 | Iwai | |
| 7,782,648 B2 | 8/2010 | Matsuo et al. | |
| 2014/0225110 A1 * | 8/2014 | Nayak | H01L 22/14 257/48 |
| 2016/0133336 A1 * | 5/2016 | Lim | G11C 19/28 365/230.03 |

* cited by examiner

Primary Examiner — Tri M Hoang
(74) Attorney, Agent, or Firm — Muncy, Geissler, Olds & Lowe, P.C.

(57) ABSTRACT

A fuse array and a memory device are provided in the invention. The fuse array includes a plurality of fuses and a plurality of first D flip-flops. The fuses are configured to generate a plurality of data signals. Each of the first D flip-flops is respectively coupled to one corresponding fuse of the fuses to receive the data signal from the corresponding fuse and the first D flip-flops transmit a clock signal and the data signal to a plurality of second D flip-flops comprised in a plurality of memory cells. The first D flip-flops are connected in series and the second D flip-flops are connected in series.

18 Claims, 6 Drawing Sheets

FUSE ARRAY AND MEMORY DEVICE

CROSS REFERENCE TO RELATED APPLICATIONS

This Application claims priority of CN Patent Application No. 201710450312.6 filed on Jun. 15, 2017, the entirety of which is incorporated by reference herein.

BACKGROUND OF THE INVENTION

Field of the Invention

The invention generally relates to memory device technology, and more particularly, to memory device technology for transmitting the signals of a fuse array through D flip-flops which are connected in series.

Description of the Related Art

In order to increase the production yield rate of the semiconductor memory and decrease the cost of production, each memory cell in the memory device is configured with a redundancy memory. When some of the word lines or bit lines of the memory cell break down, the word lines or bit lines of the redundancy memory will be used to repair them.

In traditional methods, the word lines or bit lines of a redundancy memory may replace the broken down word lines or bit lines of the memory cell by fusing the fuse using the laser. However, as semiconductor manufacturing and processing technology has progressed, the size of semiconductor memory devices is becoming smaller. Therefore, the fuse (or fuse array) may be located outside of the memory cell to save space in the memory cell. Furthermore, each fuse is connected to a controller through a signal line to indicate whether to use the word lines or bit lines of the redundancy memory to replace the broken down word lines or bit lines of the memory cell.

However, when all fuses are located outside of the memory cell, it means that when there are more and more signals that need to be transmitted (i.e. there are more allocated fuses), the number of signal lines will increase. Therefore, the signal lines will occupy a greater layout area in the semiconductor memory device, and as a result, the difficulty of designing the layout of the semiconductor memory device will increase.

BRIEF SUMMARY OF THE INVENTION

A fuse array and memory device transmitting the signals of the fuse array through D flip-flops connected in series are provided to overcome the problems described above.

An embodiment of the invention provides a fuse array. The fuse array comprises a plurality of fuses and a plurality of first D flip-flops. The plurality of fuses are configured to generate a plurality of data signals. Each of the first D flip-flops is coupled to a corresponding fuse of the fuses respectively to receive the data signals generated by the corresponding fuse, and the plurality of first D flip-flops transmit a clock signal and the data signals to a plurality of second D flip-flops of a plurality of memory cells. The first D flip-flops are connected in series and the second D flip-flops are connected in series.

An embodiment of the invention provides a memory device. The memory device comprises a plurality of memory cells, a clock generator, and a fuse array. Each of the memory cells comprises a memory array and a redundancy array. The clock generator is configured to generate clock signals. The fuse array comprises a plurality of fuses and a plurality of first D flip-flops. The plurality of fuses may generate a plurality of data signals. The plurality of first D flip-flops are coupled to the clock generator to receive the clock signals and each of the first D flip-flops is coupled to a corresponding fuse of the fuses respectively to receive the data signals generated by the corresponding fuse. Furthermore, the plurality of first D flip-flops transmit the clock signals and the data signals to a plurality of second D flip-flops of the plurality of memory cells. The first D flip-flops and the second D flip-flops are connected in series and the number of first D flip-flops is the same as the number of second D flip-flops.

Other aspects and features of the invention will become apparent to those with ordinary skill in the art upon review of the following descriptions of specific embodiments of the memory device.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
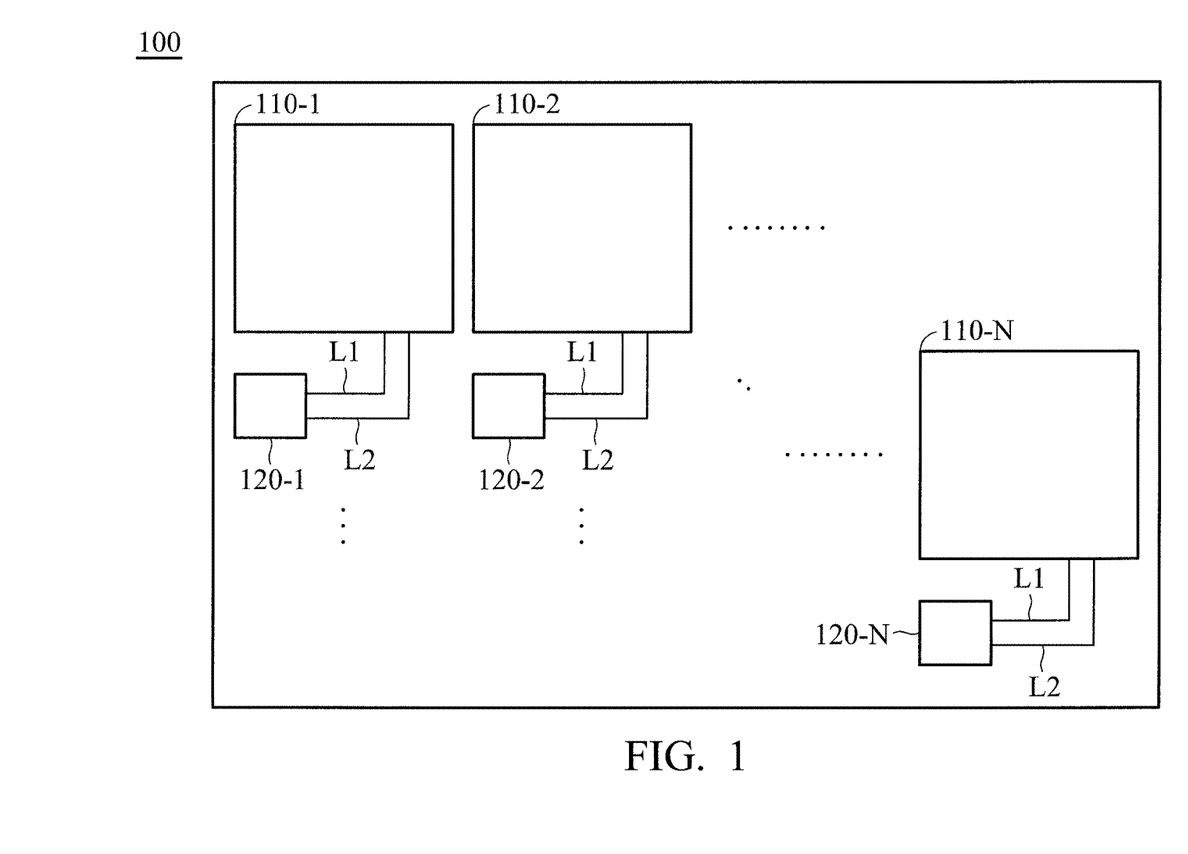
FIG. 1 is a block diagram of a memory device 100 according to an embodiment of the invention.

FIG. 1 is a block diagram of a memory device 100 according to an embodiment of the invention. In some embodiments of the invention, the memory device 100 may be a volatile memory device, such as a dynamic random access memory (DRAM), but the invention should not be limited thereto. In some embodiments of the invention, the memory device 100 may be a non-volatile memory device, such as a read only memory (ROM), but the invention should not be limited thereto. As shown in FIG. 1 the memory device 100 may comprise a plurality of memory cells 110-1~110-N and a plurality of fuse arrays 120-1~120-N, wherein each memory cell corresponds to one fuse array, and the fuse array may transmit signal to memory cell through the data line L1 and the clock line L2. Note that, in order to clarify the concept of the invention, FIG. 1 presents a simplified block diagram in which only the elements relevant to the invention are shown. However, the invention should not be limited to what is shown in FIG. 1. The memory device 100 may comprise other elements.

In an embodiment of the invention, a plurality of fuse arrays 120-1~120-N may be integrated into a fuse array. According to the embodiments of the invention, in the memory device 100, the fuse arrays 120-1~120-N may be located in any appropriate location outside the memory cells 110-1~110-N. Namely, in the invention, the location allocated to the fuse arrays 120-1~120-N should not be limited to the location shown in FIG. 1.

Furthermore, in order to clarify the concept of the invention, only one memory cell 110 and fuse array 120 are used to describe the embodiments of the invention below. Namely, the operations of the memory cell 110 and the fuse array 120 can be applied to each of the memory cells 110-1~110-N and each of the fuse arrays 120-1~120-N.

Figure 2:
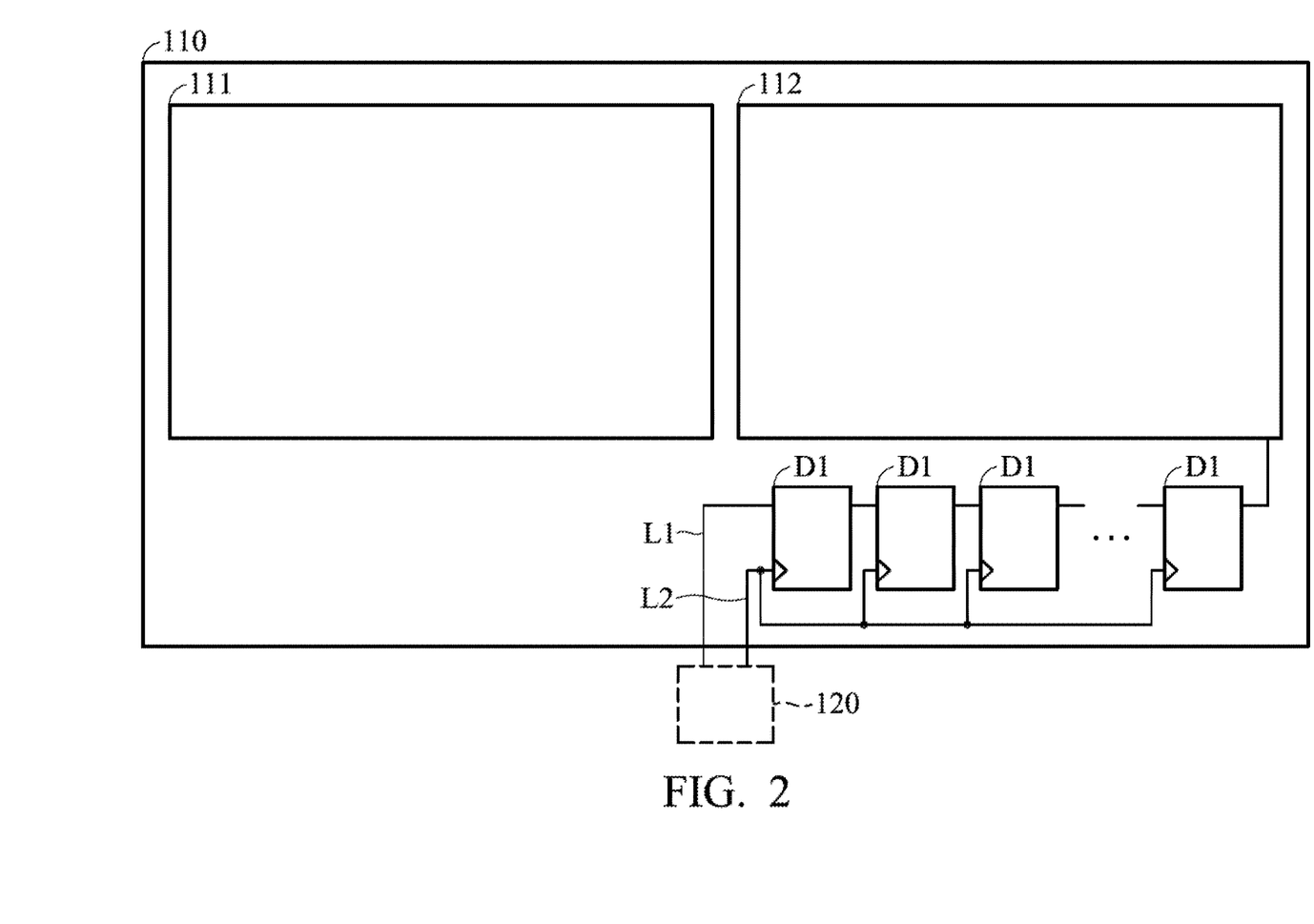
FIG. 2 is a schematic diagram of the memory cell 110 according to an embodiment of the invention.

FIG. 2 is a schematic diagram of the memory cell 110 according to an embodiment of the invention. As shown in FIG. 2, in an embodiment of the invention, the memory cell 110 may comprise a memory array 111, a redundancy array 112 and a plurality of D flip-flops D1. Note that, in order to clarify the concept of the invention, FIG. 2 presents a simplified block diagram in which only the elements relevant to the invention are shown. However, the invention should not be limited to what is shown in FIG. 2. The memory cell 110 may comprise other elements.

The memory array 111 is composed by a plurality of word lines and bit lines. The redundancy array 112 may be a redundancy memory. When the word lines or bit lines of the memory array 111 break down, the word lines or bit lines of the redundancy array 112 can be utilized to replace the broken word lines or bit lines of the memory array 111. In the embodiments of the invention, a plurality of D flip-flops D1 are connected in series. The D flip-flops D1 in series may be connected to the fuse array 120 through a data line L1 and a clock line L2 to receive the clock signals and information signals transmitted from the fuse array 120. The signals received by the D flip-flops D1 from the fuse array 120 will be transmitted to a controller or a controlling circuit (not shown in figures). In some embodiments of the invention, the controller may decode the received signal and determine whether to replace the original word lines or bit lines (i.e. the word lines or bit lines of the memory array 111) using the word lines or bit lines of the redundancy array 112 according to the decoded signals. For example, if the decoded address data is the same as the registered address data (meaning that one word line or one bit line corresponding to the address data in the memory array 111 has broken down), the controller may indicate that one word line or bit line of the redundancy array 112 is needed to replace the broken word line or bit line corresponding to the address data in the memory array 111. In some embodiments of the invention, the controller may further determine whether the signal transmitted from the marked fuse is received to determine whether to replace the original word lines or bit lines (i.e. the word lines or bit lines of the memory array 111) using the word lines or bit lines of the redundancy array 112.

Figure 3:
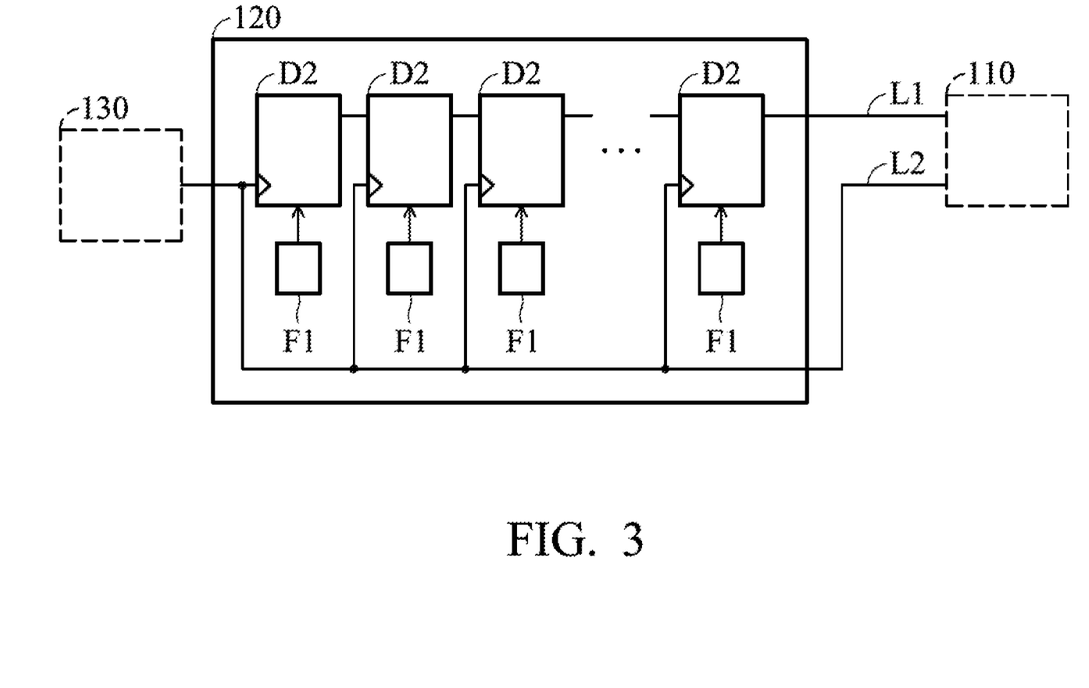
FIG. 3 is a schematic diagram of the fuse array 120 according to an embodiment of the invention.

FIG. 3 is a schematic diagram of the fuse array 120 according to an embodiment of the invention. As shown in FIG. 3, in an embodiment of the invention, the fuse array 120 comprises a plurality of fuses F1 and a plurality of D flip-flops D2. In the embodiment, the number of fuses F1 is the same as the number of D flip-flops D2, and each of the fuses F1 is respectively coupled to a D flip-flop D2 to provide the signals to the respective D flip-flop D2. In the embodiments of the invention, the D flip-flops D2 are connected in series, and the D flip-flops D2 in series are connected to the D flip-flops D1 of the memory cell 110 through the data line L1 and the clock line L2 to transmit the clock signals and information signals to the D flip-flops D1. In the embodiments of the invention, the number of D flip-flops D1 is the same as the number of D flip-flops D2.

In the embodiments of the invention, the signals generated by the fuses F1 are transmitted through the D flip-flops D2 in series. Thus, only one data line L1 and one clock line are needed to transmit the signals. Therefore, the problem that occurs because too many signal lines are used to connect to each of the fuses F1 to transmit the signals generated by the fuses F1 can be solved.

In the embodiments of the invention, the fuses F1 may be divided into a plurality of groups, and each group of fuses F1 may correspond to one word line or one bit line of the redundancy array 112. For example, if one word line or one bit line of the redundancy array 112 corresponds to 8 bits-address data, the fuses F1 will be divided into groups of 8 bits to provide the data to the corresponding word line or bit line.

In an embodiment of the invention, the fuse F1 may be a laser fuse. In the embodiment of the invention, if the fuse F1 is a laser fuse (i.e. a traditional fuse), when one word line or bit line of the memory array 111 breaks down, the laser device will fuse the fuse to transmit a signal (e.g. if the fuse is fused, the transmitted signal is 1; and if the fuse is not fused, the transmitted signal is 0) to the D flip-flop D1 to indicate that one word line or bit line of the redundancy array 112 should be used to replace the broken word line or bit line of the memory array 111.

In another embodiment of the invention, the fuse F1 may be an electronic fuse. In the embodiment of the invention, if the fuse F1 is an electronic fuse, when one word line or bit line of the memory array 111 breaks down, the semiconductor element (e.g. a Metal-Oxide-Semiconductor Field-Effect Transistor, MOSFET) of the fuse F1 will be enabled by the high voltage to transmit a signal (e.g. if the semiconductor element is enabled, the transmitted signal is 1; and if the semiconductor element is disabled, the transmitted signal is 0) to the D flip-flop D1 to indicate that one word line or bit line of the redundancy array 112 should be used to replace the broken word line or bit line of the memory array 111.

In an embodiment of the invention, the memory device 100 may comprise a clock generator 130. The clock generator 130 is coupled to the D flip-flops D2 to provide the clock signals to the D flip-flops D2. The clock signals generated by the clock generator 130 are shared by each of the D flip-flops D1 and each of the D flip-flops D2. Namely, the clock signals generated by the clock generator 130 may be provided to the D flip-flops D1 and the D flip-flops D2 through the clock line L2 at the same time. The number (the number of periods) of the clock signals generated by the clock generator 130 is determined by the number of transmitted signals. For example, if there are 9600 pieces of data that need to be transmitted, the clock generator 130 may generate 9600 clock signals.

In an embodiment of the invention, when there is not enough transmission time, the fuse array 120 may be divided into a plurality of blocks, and the blocks can be used through the parallel processing at the same time. The D flip-flops D2 and the fuses F1 will be allocated to each block evenly. In the embodiment of the invention, each block may comprise a data line and a clock line to connect its D flip-flops D2 in series. For example, if the fuse array 120 needs to transmit 9600 pieces of data, when there is not enough transmission time, the fuse array 120 may be divided into 4 blocks for parallel processing. Namely, each block may transmit 2400 pieces of data and each block may comprise a data line and a clock line to connect its D flip-flops D2 in series and transmit the information signal and the clock signal to the D flip-flops D1 of the memory cell 110. In the embodiment of the invention, the D flip-flops D1 are also divided into 4 groups which respectively correspond to the 4 blocks to receive the corresponding information signal and clock signal.

Figure 4:
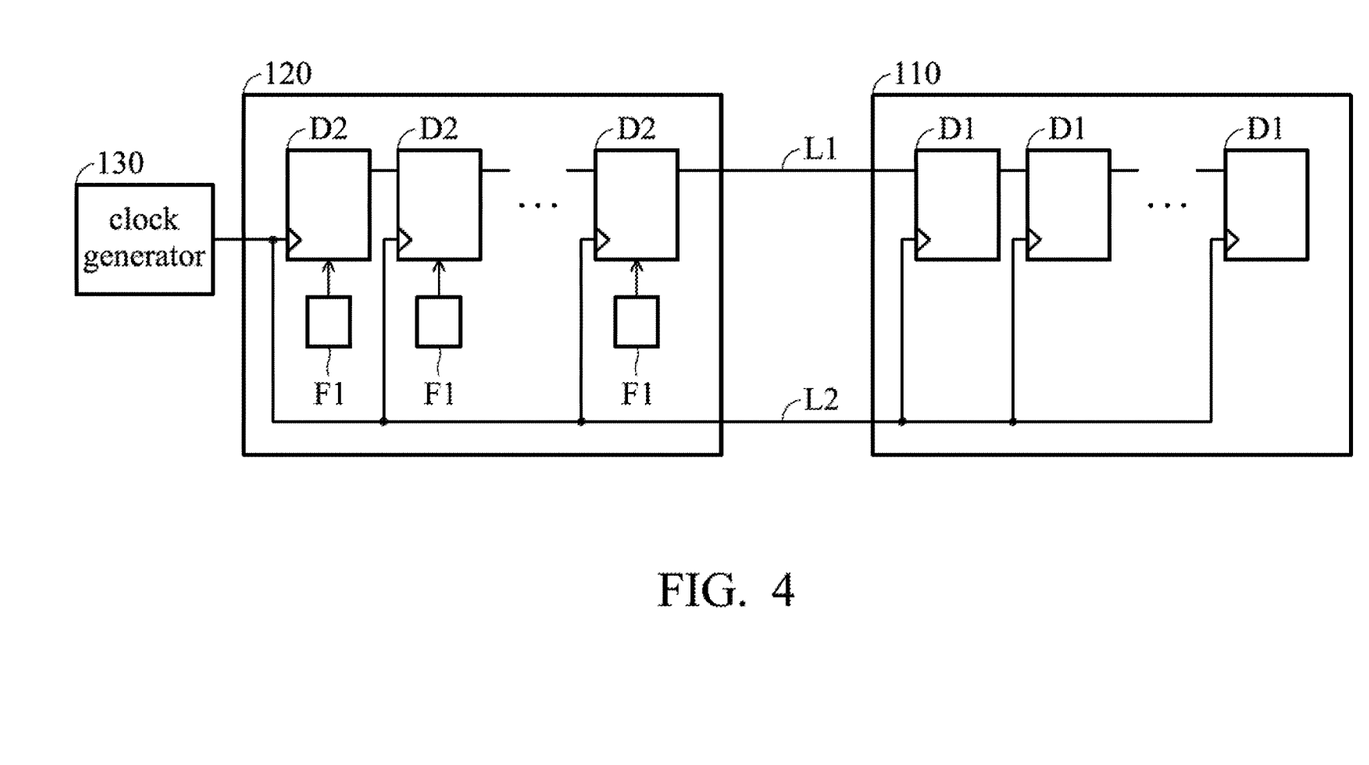
FIG. 4 is a schematic diagram of the connection relationship of the D flip-flops D1 and the D flip-flops D2 according to an embodiment of the invention.

FIG. 4 is a schematic diagram of the connection relationship of the D flip-flops D1 and the D flip-flops D2 according to an embodiment of the invention. As shown in FIG. 4, the data pin of each D flip-flop D2 may be coupled to a fuse F1 to receive the data generated by the fuse F1, and the clock pin of each D flip-flop D2 may be coupled to the clock generator 130 to receive the clock signal. Furthermore, the D flip-flops D1 and the D flip-flops D2 may be connected in series through the data line L1 and the clock line L2, and the D flip-flops D2 may transmit the data signal and clock signal to the D flip-flops D1 through the data line L1 and the clock line L2.

Figure 5A:
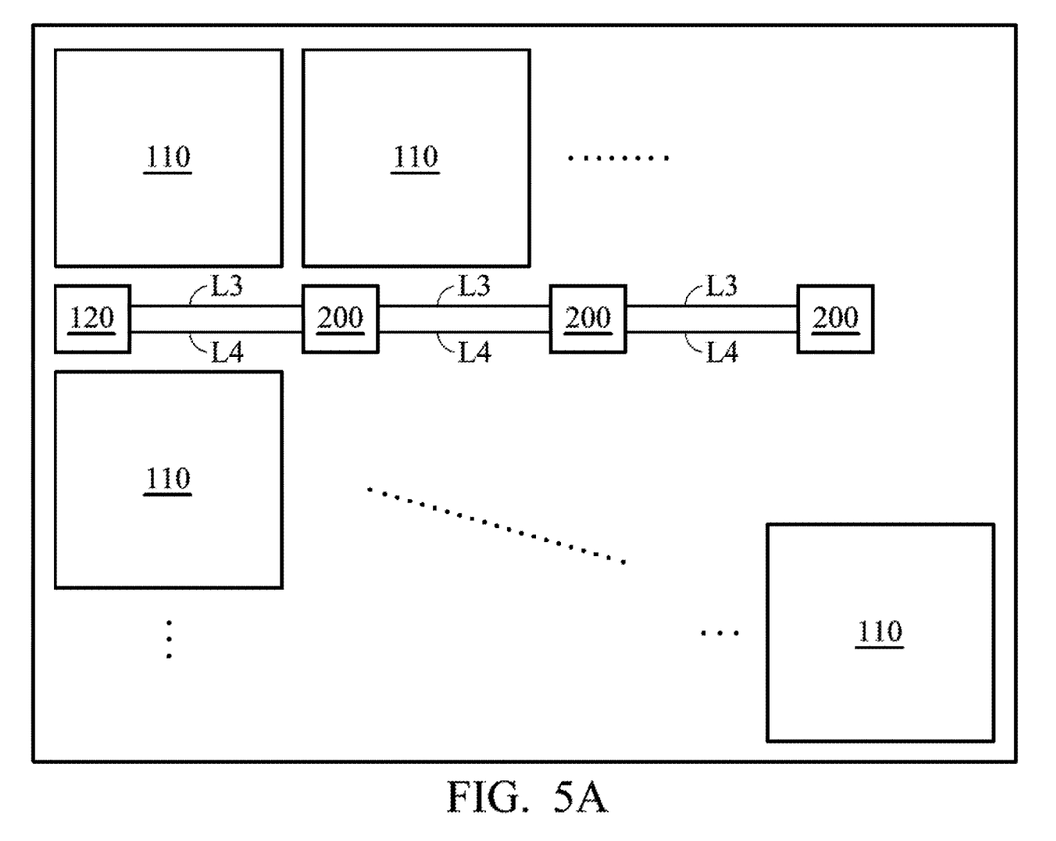
FIG. 5A is a schematic diagram of adjusting a plurality of circuits via the fuse array 120 according to an embodiment of the invention.

FIG. 5A is a schematic diagram of adjusting a plurality of circuits via the fuse array 120 according to an embodiment of the invention. As shown in FIG. 5A, in an embodiment of the invention, the memory device 100 may comprise one or a plurality of circuits 200 which need to be adjusted (e.g. the clock of the circuit 200 needs to be adjusted). In the embodiments of the invention, one or more D flip-flops D3 may be allocated to each circuit 200 to receive the adjusting signal from the fuse array 120, wherein the number of allocated D flip-flops D3 for each circuit 200 is determined by the number of signals that need to be adjusted in the circuit 200. In the embodiment of the invention, the fuse array 120 may comprise a plurality of adjusting fuses (or option fuses) F2 and a plurality of D flip-flops D4. The adjusting fuses F2 are utilized to adjust the circuits 200 in the memory device 100. When one of the circuits 200 needs to be adjusted, the controller (not shown in figures) of the memory device 100 may transmit the adjusting signal to the circuit 200 by fusing the adjusting fuse F2 to adjust the circuit 200. The adjusting signals may be transmitted to each circuit 200 which needs to be adjusted through the data line L3 and the clock line L4.

Figure 5B:
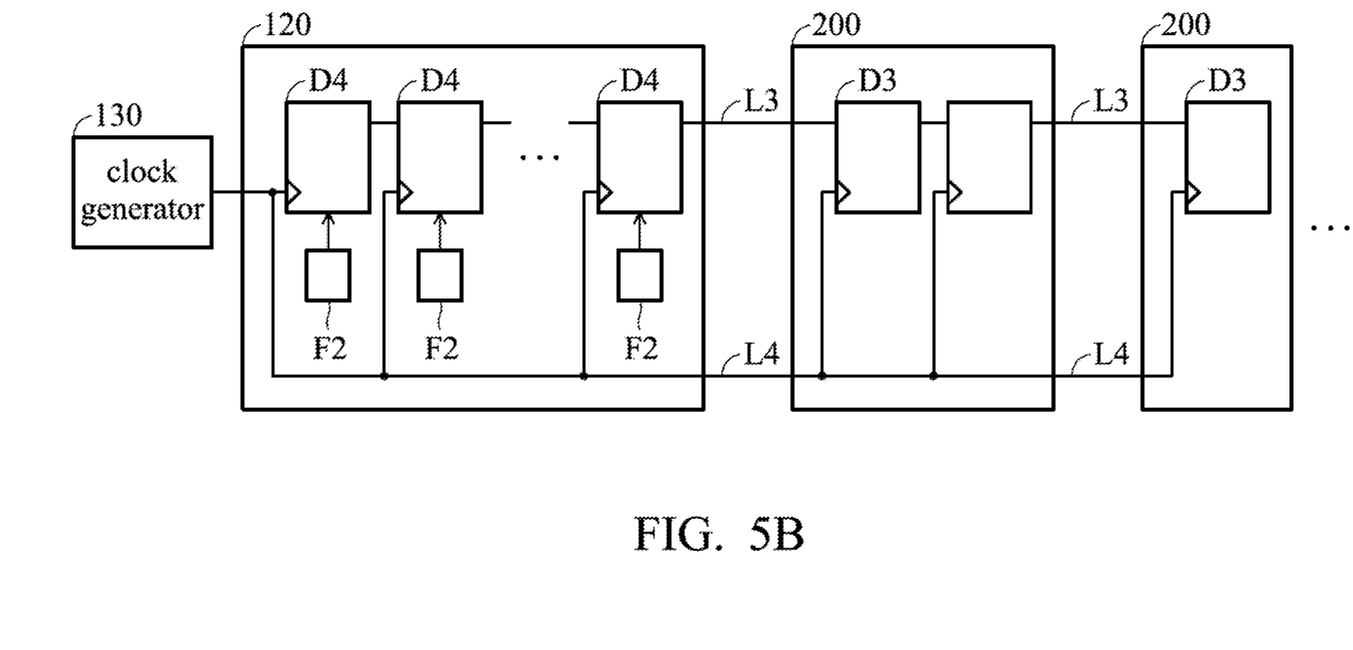
FIG. 5B is a schematic diagram of the connection relationship of the D flip-flops D3 and the D flip-flops D4 according to an embodiment of the invention.

FIG. 5B is a schematic diagram of the connection relationship of the D flip-flops D3 and the D flip-flops D4 according to an embodiment of the invention. As shown in FIG. 5B, the D flip-flops D4 are connected in series, and the data pin of each D flip-flop D4 may be coupled to a fuse F2. The number of fuses F2 is the same as the number of D flip-flops D4. In the embodiment of the invention, the D flip-flops D3 and the D flip-flops D4 are connected in series and the number of D flip-flops D3 is the same as the number of D flip-flops D4. In the embodiment of the invention, the clock generator 130 may be coupled to the D flip-flops D4 to provide clock signals to the D flip-flops D3 and the D flip-flops D4. The adjusting signals and clock signals may be transmitted from the D flip-flops D4 to the D flip-flops D3 through the data line L3 and the clock line L4.

According to the memory device 100 provided in the invention, when the fuse array is independently allocated outside the memory cell, the fuse array only needs to utilize a data line or a clock to transmit the signal generated by the fuses to the memory cell. Therefore, the placement of too many signal lines in the layout area can be avoided. Furthermore, the memory device 100 provided in the invention can be applied to adjust the circuits through the adjusting fuses.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A fuse array, comprising:
   a plurality of fuses, generating a plurality of data signals; and
   a plurality of first D flip-flops, respectively coupled to a corresponding fuse of the fuses to receive the data signals generated by the corresponding fuse, receiving a clock signal from a clock generator and transmitting the clock signal and the data signals to a plurality of second D flip-flops of a plurality of memory cells, wherein the first D flip-flops are connected in series and the second D flip-flops are connected in series.

2. The fuse array of claim 1, further comprising:
   a data line, configured to transmit the data signals from the first D flip-flops to the second D flip-flops; and
   a clock line, configured to provide the clock signal to the first D flip-flops and the second D flip-flops.

3. The fuse array of claim 1, wherein the fuse array is divided into a plurality of blocks, and data corresponding to each of the blocks are processed at the same time.

4. The fuse array of claim 3, wherein each block comprises a different part of the fuses and each block is allocated a corresponding data line and a corresponding clock line.

5. The fuse array of claim 1, wherein the fuses are laser fuses or electronic fuses.

6. A memory device, comprising
   a plurality of memory cells, wherein each of the memory cells comprises a memory array and a redundancy array;
   a clock generator, generating clock signals; and
   a fuse array, wherein the fuse array comprises:
      a plurality of fuses, generating a plurality of data signals; and
      a plurality of first D flip-flops, coupled to the clock generator to receive the clock signals and respectively coupled to one corresponding fuse of the fuses to receive the data signals generated by the corresponding fuse, and transmitting the clock signals and the data signals to a plurality of second D flip-flops of the plurality of memory cells, wherein the first D flip-flops are connected in series and the second D flip-flops are connected in series.

7. The memory device of claim 6, wherein the first D flip-flops and the second D flip-flops are connected in series.

8. The memory device of claim 6, wherein the number of first D flip-flops is the same as the number of second D flip-flops.

9. The memory device of claim 6, wherein the second D flip-flops are divided into a plurality of groups, and each group of second D flip-flops respectively corresponds to one word line or bit line of the redundancy array.

10. The memory device of claim 9, comprising:

a controlling circuit, determining whether to enable the word line or bit line of the redundancy array according to an output signal from the second D flip-flops.

11. The memory device of claim 6, further comprising:

a data line, configured to transmit the data signals from the first D flip-flops to the second D flip-flops; and a clock line, configured to provide the clock signals to the first D flip-flops and the second D flip-flops.

12. The memory device of claim 6, wherein the fuse array is divided into a plurality of blocks, and data corresponding to each of the blocks are processed at the same time.

13. The memory device of claim 12, wherein each block comprises a different part of the fuses and each block is allocated a corresponding data line and a corresponding clock line.

14. The memory device of claim 6, wherein the fuses are laser fuses or electronic fuses.

15. The memory device of claim 6, wherein the number of clock signals generated by the clock generator in a period is the same as the number of first D flip-flops.

16. The memory device of claim 6, further comprising:

a plurality of circuits which need to be adjusted; and a plurality of third D flip-flops, wherein each of the circuits which need to be adjusted comprises one or more of the third D flip-flops.

17. The memory device of claim 16, further comprising:

a plurality of adjusting fuses; and a plurality of fourth D flip-flops, wherein the number of adjusting fuses is the same as the number of fourth D flip-flops.

18. The memory device of claim 17, wherein the third D flip-flops and the fourth D flip-flops are connected in series, and the number of third D flip-flops is the same as the number of fourth D flip-flops.

* * * * *